United States Patent [19]

Beneking

[11] 3,878,406

[45] Apr. 15, 1975

[54] CIRCUIT ARRANGEMENT FOR DRIVING LIGHT EMITTING SEMICONDUCTOR COMPONENTS

[75] Inventor: Heinz Beneking, Aachen, Germany

[73] Assignee: Licentia Patent-Verwaltungs-G.m.b.H., Frankfurt am Main, Germany

[22] Filed: July 17, 1973

[21] Appl. No.: 379,980

[30] Foreign Application Priority Data

July 21, 1972 Germany............................ 2235866

[52] U.S. Cl. ................ 307/304; 250/553; 307/311; 315/169 R; 340/324 M; 357/17; 357/41; 357/45

[51] Int. Cl. ............................................. H03k 3/26

[58] Field of Search ............ 307/304, 311; 250/552, 250/553; 313/108 D, 109.5; 315/169, 169 TV; 340/166 EL, 324 M; 357/17, 41, 45

[56] References Cited

UNITED STATES PATENTS

| | | | |
|---|---|---|---|
| 3,309,610 | 3/1967 | Yamamoto | 307/304 |
| 3,388,292 | 6/1968 | Burns | 315/169 |
| 3,517,258 | 6/1970 | Lynch | 315/169 TV |
| 3,631,251 | 12/1971 | Lehovec | 315/169 |
| 3,675,064 | 7/1972 | Coleman et al. | 313/108 D |
| 3,696,393 | 10/1972 | McDonald | 340/324 R |
| 3,723,749 | 3/1973 | Shapiro | 340/324 M |
| 3,740,570 | 6/1973 | Kaelin et al. | 340/166 EL |

OTHER PUBLICATIONS

"MOS Current Driver for Led's" by Schlig in IBM Tech. Discl. Bull. Vol. 15, No. 2, July 1972, pages 498–499.

*Primary Examiner*—Stanley D. Miller, Jr.
*Attorney, Agent, or Firm*—Spencer & Kaye

[57] ABSTRACT

A circuit arrangement for driving light emitting semiconductor components comprises a light emitting component which is connected in series with the controllable current path of a field effect transistor tetrode, one control electrode of the tetrode being fed with a voltage driving the tetrode in the range of this control electrode and the other control electrode being fed with a voltage corresponding to the desired luminous intensity of the light emitting component.

12 Claims, 2 Drawing Figures

CIRCUIT ARRANGEMENT FOR DRIVING LIGHT EMITTING SEMICONDUCTOR COMPONENTS

BACKGROUND OF THE INVENTION

The invention relates to a circuit arrangement for driving light emitting semiconductor components. Semiconductor arrangements which comprise a plurality of light spots are already known. These light spots are, for example, luminescence diodes. Such multiple arrangements are, for example, necessary for reading punched cards, for digital display or for building up screens. Hitherto it required a large circuitry expense in order to control the desired individual picture points.

SUMMARY OF THE INVENTION

It is an object of the present invention to provide a particularly simple circuit control.

It is a further object of the invention to provide an arrangement by means of which picture lines, which can for example be part of a television picture, can be controlled and accommodated in a semiconductor body in an integrated form.

According to the invention, there is provided a circuit arrangement for driving light emitting semiconductor components, comprising a light emitting component, connected in series with the controllable current path of a field effect transistor tetrode, a voltage being fed to one control electrode of the tetrode for driving the tetrode in the region of this control electrode, and a voltage corresponding to the desired luminous intensity of the light emitting component being applied to the other control electrode.

BRIEF DESCRIPTION OF THE DRAWINGS

The invention will now be described in greater detail, by way of example, with reference to the drawings, in which.

DESCRIPTION OF THE PREFERRED EMBODIMENT

Figure 1:
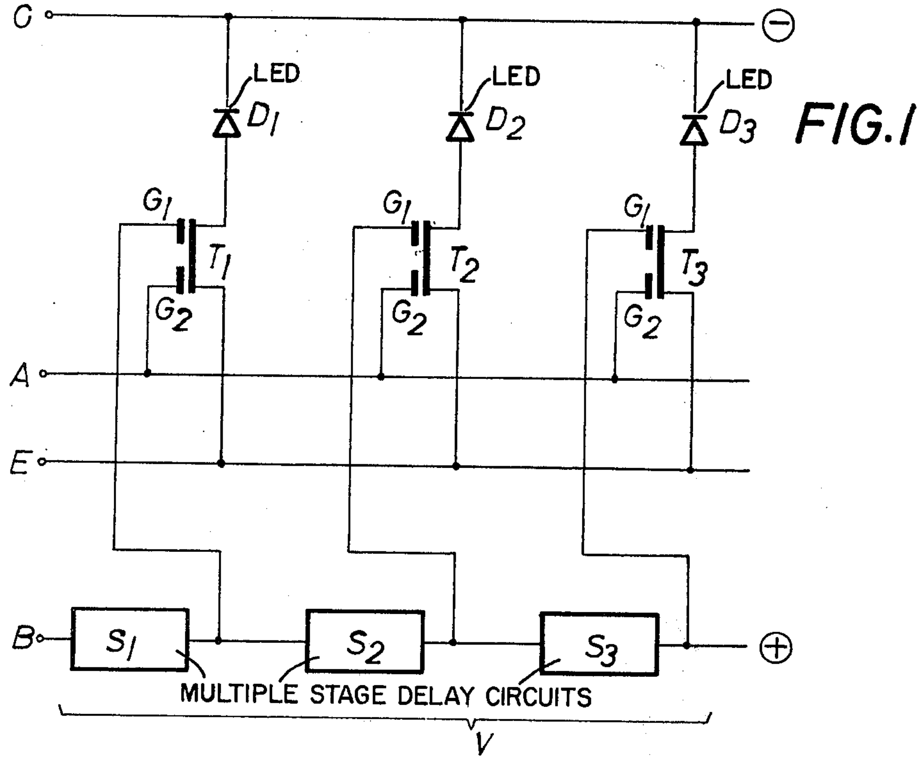
FIG. 1 is a circuit diagram of one form of circuit according to the invention.

Basically the invention proposes that a light emitting component which emits light is connected in series with the controllable current path of a field effect transistor tetrode and that a voltage driving the tetrode in the region of this control electrode is fed to one control electrode of the tetrode, whereas there is applied to the other control electrode, a voltage corresponding to the desired luminous density of the component emitting light.

In the case of the tetrode this is suitably, for example, a depletion layer field effect transistor with two control electrodes arranged above the channel region. A voltage by which the current flow in the channel range is eliminated is applied to the control electrode in the turned off state. In the operating state a voltage by which the blocking of the transistor in the channel region lying under this control electrode is neutralized, is applied to the control electrode. A current flow through the transistor is moreover possible only if also a voltage neutralizing the constriction of the channel is present at the second control electrode. This voltage corresponds to the desired luminous density of the connected luminous component. Then a current exciting the luminous component can flow through the channel region, which current is interrupted if there is a constriction caused by a change in potential of the first control electrode.

From the basis of triggering an individual picture point the control of numerous image points follows in that a plurality of series circuits of luminous element and tetrode are connected in parallel with each other and in that e.g. the first control electrodes are connected to the subsequent stages of a delay circuit in such a manner that, in the case of an input signal applied to the delay circuit, the first control electrodes of the different tetrodes have a voltage applied to them one after the other, the voltage driving the appropriate tetrode only in the region of this control electrode. The second control electrodes are connected to a common input electrode, to which a voltage corresponding to the desired luminous density of the controlled component is applied.

The tetrodes are preferably depletion layer field effect transistor tetrodes, the depletion layers comprising diffused pn-junctions with connected control electrodes or rectifying metal semiconductor contacts (Schottky contacts).

For the integration of the circuit, the tetrodes and the luminous components are accommodated in a common semiconductor body. A line of the luminescence diodes can be realized, for example, by a pn-junction separating two semiconductor regions of opposite type of conductivity from each other and which junction is common to all diodes. The two semiconductor regions then have preferably the shape of narrow strips arranged one on top of the other, wherein the individual luminous diodes are formed by the activation of limited regions of the pn-junction between the two semiconductor regions.

The semiconductor arrangement in accordance with the invention comprises, for example, a semiconductor base body, on which a semiconductor layer is found, on which again is arranged the luminescence diode on an upper surface region. The semiconductor layer has the same type of conductivity as the adjacent region of the luminescence diodes. Thus the said semiconductor layer forms the controllable current path of the tetrode and at the same time in the region of the luminescence diodes the connection of these diodes to the tetrodes without additional contacting means. The basic body is either highly resistive or of the type conductivity opposite to that of the semiconductor layer. Two control electrodes are arranged spaced apart on a freely located upper surface region of the semiconductor layer forming the channel for the tetrodes. These control electrodes comprise for example Schottky contacts to which are applied a voltage constricting the channel layer in the turned off state of the luminous diodes.

Referring now to the drawings, FIG. 1 shows the circuit arrangement in accordance with the invention, wherein the part of the circuit shown has been restricted for the sake of clarity to three luminous diodes $D_1$, $D_2$ and $D_3$. Each diode is connected in series with the controllable current path of a tetrode $T_1$, $T_2$, $T_3$. Each tetrode has two control electrodes $G_1$ and $G_2$. Further, a delay circuit V is provided which comprises three stages $S_1$, $S_2$, $S_3$. This delay circuit can be realised for example by a shift register or by a delay line. The signal applied to the input electrode B first causes a voltage change at the output of $S_1$ which change then occurs at the output of $S_2$ and $S_3$ one after the other. The control electrode $G_1$ of the tetrode $T_1$ is connected to the output of $S_1$. Correspondingly $G_1$ of $T_2$ would accordingly be connected at the output of $S_2$ and $G_1$ of $T_3$ at the output of $S_3$. The second control electrode of all tetrodes are connected to the common connection A. The driving voltage is applied between the series circuits connected in parallel, which series circuits are made up of a diode and a tetrode each. (Between C and E). A signal is applied to the electrode A, which signal corresponds to the desired brightness of the luminous element controlled in each case by means of the delay circuit. In this way, the diodes $D_1$ up to $D_3$ light up one after the other with the required brightness. By increasing the number of components a line of luminous points is obtained which are run through with a speed determined by the delay circuit. Such a picture line can for example be a part of an assembled television picture. The function of the control electrodes $G_1$, $G_2$ can also be interchanged.

Figure 2:
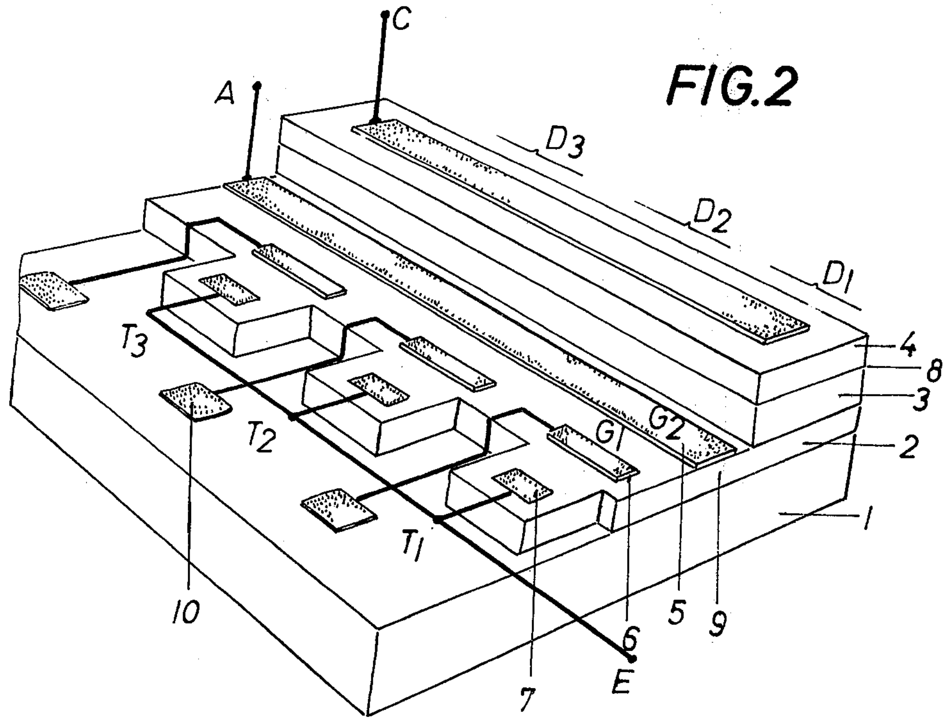
FIG. 2 is a perspective view of an integrated circuit arrangement for the circuit of FIG. 1.

FIG. 2 shows how a circuit arrangement according to FIG. 1 can be integrated in a semiconductor body.

The base body 1 comprises, for example, gallium arsenide, which is semi-insulating (e.g. specific resistance greater than $10^5$ ohm cm) or of a type of conductivity opposite to that of a semiconductor layer 2. The semiconductor layer 2 comprises, for example, GaAs of n-type conductivity and forms the controllable channel of the tetrode. It therefore has a thickness which is preferably $< 1\ \mu m$. A strip-form diode line of the type of conductivity opposite to that of regions 3 and 4 is found at one end of this layer. This region 3 is in the case of an n-type conductivity region 2 likewise of *n*-type conductivity and thus forms the connection of the diodes to the drain electrodes of the tetrodes $T_1$, $T_2$, $T_3$. The region 3 comprises, for example, $Ga_xAl_{1+x}As$ and is doped with tellurium. X has the value of one-third for example. The layer 4 of *p*-type conductivity which is doped for example with zinc, likewise comprises $Ga_xAl_{1+x}As$. The pn-junction 8 common to all diodes $D_1$, $D_2$, $D_3$ is activated in each case in the region of the controlled tetrode and emits a brightness corresponding to the potential at a control electrode 5. To the end of the layer 2 away from the luminous diodes are applied the source electrodes 7, between which and the diode line run the two control electrodes 5 and 6 on the upper surface of the layer 2. These control electrodes preferably form Schottky contacts with the semiconductor layer 2. The control electrode 5 common to all the tetrodes corresponds to the control electrodes $G_2$ in the circuit according to FIG. 1, whereas the control electrodes 6 separated from each other correspond to $G_1$ and are provided for the connection to the delay circuit V. These control electrodes can lead via conductive paths to the connection surfaces 10 of the semi-insulating base body.

The controllable region under the control electrodes in the channel region 9 is so thin that, in the case of a suitable potential applied to the control electrodes is constricted by the space charge regions starting from the control electrodes. This constriction can be neutralised by the potential change, wherein a current flow between this electrode 7 and the associated diode is possible only if both space charge regions going from the control electrode no longer reach up to the base body.

The space charge region below the control electrode 5 is neutralized as completely as possible by the potential change starting from the delay circuit, whereas the space charge region for the control electrode 6 is reduced only insofar as the controlled diode emits the desired brightness.

The channel region can also be influenced by the space charge regions starting from the pn-junction instead of by the Schottky contact electrodes, wherein these pn-junctions can be arranged at the upper surface of the layer 2. On the other hand at least one pn-junction can be provided in the transition region between base body 1 and layer 2.

It will be understood that the description of the present invention is suceptible to various modification changes and adaptations.

What is claimed is:

1. A circuit arrangement for driving light emitting semiconductor components, comprising a light emitting component connected in series with the controllable current path of a field effect transistor tetrode, a voltage being fed to one control electrode of the tetrode for driving that part of the tetrode which is in the region of this control electrode and a voltage corresponding to the desired luminous intensity of the light emitting component being applied to the other control electrode.

2. A circuit arrangement as defined in claim 1, wherein a plurality of series circuits of luminous elements and tetrodes are connected parallel to each other and wherein one control electrode is connected to the following stages of a delay circuit in such a manner that, in the case of an input signal applied to the delay circuit, these control electrodes of the different tetrodes have applied to them one after the other, a voltage driving only that part of the appropriate tetrode which is in the region of this control electrode, whereas the other control electrodes are connected to a common input electrode, at which a voltage corresponding to the desired luminous density of the controlled component is applied.

3. A circuit arrangement as defined in claim 1, wherein the tetrodes are depletion layer field effect transistor tetrodes and the depletion layers comprise diffused pn-junctions with connected control electrodes.

4. A circuit arrangement as defined in claim 1, wherein the tetrodes are depletion layer field effect transistor tetrodes and the depletion layers comprise Schottky contacts.

5. A circuit arrangement as defined in claim 3, wherein a semiconductor body of GaAs of layers for the luminescence diodes of $Ga_xAl_{1+x}As$ is used.

6. A circuit arrangement as defined in claim 1, wherein a semiconductor body of a compound between elements of the III and of the V group of the periodic table is used.

7. A circuit arrangement as defined in claim 1, wherein the tetrodes and the luminous components are accommodated in a common semiconductor body.

8. A circuit arrangement as defined in claim 4, wherein the liminous components are luminescence diodes, the diodes being formed by a pn-junction which is between two semiconductor regions of opposite conductivity type, said pn-junction being common to all of the diodes, with each individual diode being rendered luminescent by the activation of a corresponding limited region of said pn-junction.

9. A circuit arrangement as defined in claim 8, wherein the luminescence diodes are arranged on a semiconductor layer which has the same type of conductivity as the adjoining region of the luminescence diodes, wherein this layer is simultaneously part of the controllable current path of the tetrodes and thus, in the region of the luminescence diodes, is the region for connection of the luminescence diodes to the tetrodes and wherein, on a free upper surface region of this layer, are arranged two control electrodes, one arranged for each tetrode, which control electrodes are spaced apart.

10. A circuit arrangement as defined in claim 9, wherein the semiconductor layer carrying the luminescence diodes is arranged on a highly resistive semiconductor base body.

11. A circuit arrangement as defined in claim 9, wherein the second control electrode is common for all tetrodes.

12. A circuit arrangement as defined in claim 6, wherein the semiconductor layer carrying the luminescence diodes is arranged on a semiconductor base body which is separated from the semiconductor layer by a pn-junction.

* * * * *